(12) United States Patent
Wang et al.

(10) Patent No.: US 9,407,234 B2
(45) Date of Patent: Aug. 2, 2016

(54) CURRENT BALANCING DEVICE AND METHOD

(71) Applicant: REALTEK SEMICONDUCTOR CORPORATION, Hsinchu (TW)

(72) Inventors: Shih-Wei Wang, Hualien County (TW); Su-Liang Liao, Hsinchu County (TW); Liang-Wei Huang, Hsinchu (TW); Sheng-Fu Chuang, Taichung (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/515,337

(22) Filed: Oct. 15, 2014

(65) Prior Publication Data
US 2015/0130439 A1  May 14, 2015

(30) Foreign Application Priority Data

Nov. 14, 2013  (TW) .............................. 102141490 A

(51) Int. Cl.
*G06F 1/26* (2006.01)
*H03H 7/40* (2006.01)

(52) U.S. Cl.
CPC ...................................... *H03H 7/40* (2013.01)

(58) Field of Classification Search
CPC ................... H02M 2001/0003; H02M 3/1584; H02M 2003/1586; G05F 1/56; G05F 1/1613; G05F 1/263
USPC ......... 323/222, 224, 271–276, 282–288, 351, 323/909; 363/16–20, 21.01, 95, 97, 98; 713/300, 320
See application file for complete search history.

(56) References Cited

U.S. PATENT DOCUMENTS 6,650,245 B2 * 11/2003 Chung .................. H01H 9/542
318/757
7,180,274 B2 * 2/2007 Chen .................. H02M 3/1588
323/222

(Continued)

FOREIGN PATENT DOCUMENTS

TW  201244553  11/2012

OTHER PUBLICATIONS

Office Action and Search report dated Jun. 17, 2015 for counterpart Taiwan application 102141490.

(Continued)

*Primary Examiner* — Rajnikant Patel
(74) *Attorney, Agent, or Firm* — WPAT, P.C., Intelletual Property Attorneys; Anthony King

(57) ABSTRACT

The present invention discloses a current balancing device and method capable of balancing an output current and an input current of a current loop. Said device comprises: a transmission circuit for outputting an output current and receiving an input current; at least one adjustable resistor set in the current loop for providing resistance according to at least one adjustment signal; and a current balancing circuit, coupled to the transmission circuit and the adjustable resistor, for determining whether the difference between the output and input currents satisfies a predetermined requirement in light of a predetermined duration and thereby generating the adjustment signal, wherein if the difference between the output and input currents fails to satisfy the predetermined requirement, the current balancing circuit will adjust the resistance of the adjustable resistor through the adjustment signal, so as to reduce the difference between the output and input currents.

20 Claims, 10 Drawing Sheets

(56) References Cited

U.S. PATENT DOCUMENTS

| | | | | |
|---|---|---|---|---|
| 7,610,498 | B2* | 10/2009 | Sutardja | G06F 1/1613 320/117 |
| 7,795,967 | B2* | 9/2010 | Nakai | H03G 1/0088 330/129 |
| 7,915,859 | B2* | 3/2011 | Kim | H02J 7/0016 320/126 |
| 8,305,787 | B2* | 11/2012 | Saint-Pierre | H02M 1/425 363/21.12 |
| 8,482,265 | B2* | 7/2013 | Chiu | H02M 3/1584 323/271 |
| 9,106,201 | B1* | 8/2015 | Chakraborty | H02M 3/1584 |
| 2012/0268283 | A1* | 10/2012 | Hsu | G01R 31/043 340/653 |
| 2013/0285630 | A1 | 10/2013 | Wang | |
| 2014/0118006 | A1 | 5/2014 | Chuang et al. | |

OTHER PUBLICATIONS

English abstract translation of the Office Action dated Jun. 17, 2015 for counterpart Taiwan application 102141490.
TW 201244553 A1 is also published as US20120268283 A1.

* cited by examiner

CURRENT BALANCING DEVICE AND METHOD

BACKGROUND OF THE INVENTION

1. Field of the Invention

The present invention relates to a balancing device and method, especially to a current balancing device and method.

2. Description of Related Art

In light of Kirchhoff Circuit Laws and Ampere's Law, signal transmission needs to be founded on a closed loop; if such a closed loop is not available, a signal can't be outputted to a reception end from a transmission end. Normally, in order to make a closed loop, one can take the signal output pin of a transmission end to be the positive electrode of a voltage source, take the ground pin of the transmission end to be the negative electrode of the voltage source, and take the signal input pin and ground pin of a reception end to be the two terminals of a load, so as to allow a signal to start off at the signal output pin of the transmission end, then go along the circuit layout of a printed circuit board to the load, and then return to the transmission end from the load along a path of relatively minimum impedance; accordingly, not only the closed loop is realized, but also the most signal energy is left to the load. In an ideal case, the aforementioned procedure could be regarded as the signal output pin of the transmission end sending an output current to the load and then the load giving an input current of the same amount back to the ground pin of the transmission end to thereby satisfy the basic requirement of closed loop. However, since the output and input currents may be determined by different matters (e.g. the paths they will go through), the two currents could be different and lead to unbalanced magnetic fluxes, which would cause problems such as electromagnetic interference (EMI).

SUMMARY OF THE INVENTION

In view of the problems of the prior art, an object of the present invention is to provide a current balancing device and method to solve the problems.

The present invention discloses a current balancing device capable of balancing an output current and an input current of a current loop. According to an embodiment of the present invention, the current balancing device comprises: a transmission circuit including an output end and an input end operable to output an output current of a current loop and receive an input current of the current loop respectively; at least one adjustable resistor set in the current loop, operable to provide resistance according to at least one adjustment signal; and a current balancing circuit, coupled to the transmission circuit and the at least one adjustable resistor, operable to determine whether the difference between the output and input currents satisfies a predetermined requirement in light of a predetermined duration and thereby generate the at least one adjustment signal, wherein if the difference between the output and input currents fails to satisfy the predetermined requirement, the current balancing circuit is operable to adjust the resistance of the at least one adjustable resistor through the at least one adjustment signal, so as to reduce the difference between the output and input currents. In this embodiment, the current balancing circuit includes: a detection voltage generating device operable to generate at least one detection voltage according to the output and input currents; and a comparing circuit operable to do comparison according to the at least one detection voltage, then determine whether the difference between the output and input currents reaches the predetermined requirement, and then generate the at least one adjustment signal or the antecedent signal thereof.

The present invention also discloses a current balancing method capable of balancing an output current and an input current of a current loop. An embodiment of the current balancing method comprises the following steps: outputting an output current of a current loop by an output end of a transmission circuit, and receiving an input current of the current loop by an input end of the transmission circuit; determining the resistance of at least one adjustable resistor set in the current loop according to at least one adjustment signal; determining whether the difference between the output and input currents satisfies a predetermined requirement within a predetermined duration, and thereby generating the adjustment signal; and if the difference between the output and input currents fails to satisfy the predetermined requirement, adjusting the resistance of the adjustable resistor through the adjustment signal, so as to reduce the difference between the output and input currents. In this embodiment, the step of generating the at least one adjustment signal includes: generating at least one detection voltage according to the output and input currents; and determining whether the difference between the output and input currents satisfies the predetermined requirement according to the at least one detection voltage and thereby generating the at least one adjustment signal or its antecedent signal.

These and other objectives of the present invention will no doubt become obvious to those of ordinary skill in the art after reading the following detailed description of the preferred embodiments that are illustrated in the various figures and drawings.

BRIEF DESCRIPTION OF THE DRAWINGS

FIG. 3b illustrates an embodiment of the detection current generating circuit of FIG. 3a.

FIG. 6b illustrates the waveforms of the signals of FIG. 6a.

FIG. 9b illustrates an embodiment of the current balancing circuit of FIG. 9a.

DETAILED DESCRIPTION OF THE PREFERRED EMBODIMENTS

The following description is written by referring to terms of this invention field. If any term is defined in this specification, such term should be explained accordingly. Besides, the connection between objects or events in the disclosed embodiments can be direct or indirect provided that these embodiments are still practicable under such connection. Said "indirect" means that an intermediate object or a physical space is existed between the objects, or an intermediate event or a time interval is existed between the events.

The present invention discloses a current balancing device and method capable of balancing an output current and an input current of a current loop to thereby prevent problems such as electromagnetic interference (EMI). The device and method are applicable to an integrated circuit (e.g. a communication IC) or a system device (e.g. a stationary or portable electronic device). Provided that an alternative means is available and reasonable, people of ordinary skill in the art can use such means similar or equivalent to those described in the specification to carry out the present invention, which implies that the scope of this invention is not limited to the embodiments in this specification. On account of that some element of the current balancing device of the present invention could be known, the detail of such element will be omitted provided that this omission nowhere dissatisfies the specification and enablement requirements. Besides, the current balancing method can be in the form of firmware and/or software which could be carried out by the current balancing device of this invention or the equivalent thereof; therefore, provided that the remaining disclosure is still enough for understanding and enablement, the following description will abridge the hardware details for carrying out the method, but put the emphasis on the steps.

Figure 1:
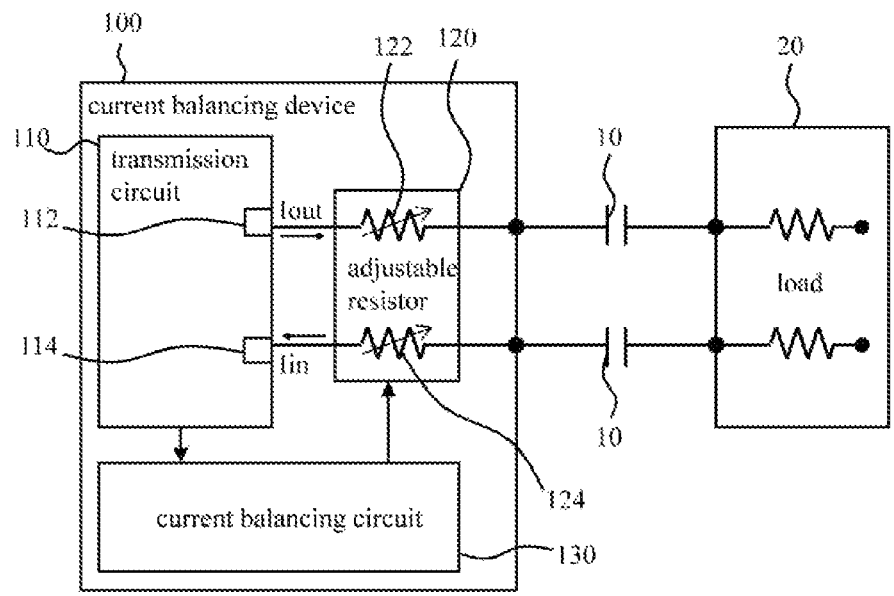
FIG. 1 illustrates an embodiment of the current balancing device of the present invention.

Please refer to FIG. 1 which illustrates an embodiment of the current balancing device of the present invention. As it is shown in FIG. 1, the current balancing device 100 of this embodiment comprises: a transmission circuit 110; at least one adjustable resistor 120; and a current balancing circuit 130. Said transmission circuit 110 includes an output end 112 and an input end 114; the output end 112 is coupled with the output path of a current loop (e.g. an AC coupling current loop with a capacitor 10) and operable to output an output current Iout to a load 20, and the input end 114 is coupled with the input path of the current loop and operable to receive an input current Iin. Said at least one adjustable resistor 120 is set in the current loop and operable to provide resistance according to at least one adjustment signal; for instance, the at least one adjustable resistor 120 includes a first adjustable resistor 122 and a second adjustable resistor 124 which are set in the aforementioned output and input paths respectively; however, as long as an implementation is practicable, people of ordinary skill in the art can merely set the first adjustable resistor 122 (under an appropriate circumstance such as the impedance of the output path less than the impedance of the input path) or the second adjustable resistor 124 (under another appropriate circumstance such as the impedance of the output path more than the impedance of the input path). Said current balancing circuit 130 is coupled with the transmission circuit 110 and the at least one adjustable resistor 120, and operable to determine whether the difference between the output current Iout and the input current Iin reaches a predetermined requirement according to a predetermined duration and thereby generate the aforementioned at least one adjustment signal; consequently, if the current balancing circuit 130 determines that the difference between the output current Iout and the input current Iin fails to satisfy the predetermined requirement, it will adjust the resistance of the adjustable resistor 120 through the at least one adjustment signal, so as to reduce the difference between the two currents Iout, Iin. For instance, provided the at least one adjustment signal includes a first adjustment signal and a second adjustment signal, if the current balancing circuit 130 finds that the output current Iout is more than the input current Iin (which means that the impedance of the output path is less than the impedance of the input path), it will increase the resistance of the first adjustable resistor 122 through the first adjustment signal and/or decrease the resistance of the second adjustable resistor 124 through the second adjustment signal; but if the current balancing circuit 130 finds that the output current Iout is less than the input current Iin (which means that the impedance of the output path is greater than the impedance of the input path), it will decrease the resistance of the first adjustable resistor 122 through the first adjustment signal and/or increase the resistance of the second adjustable resistor 124 through the second adjustment signal, so that the difference between the output current Iout and the input current Iin could be diminished.

Figure 2:
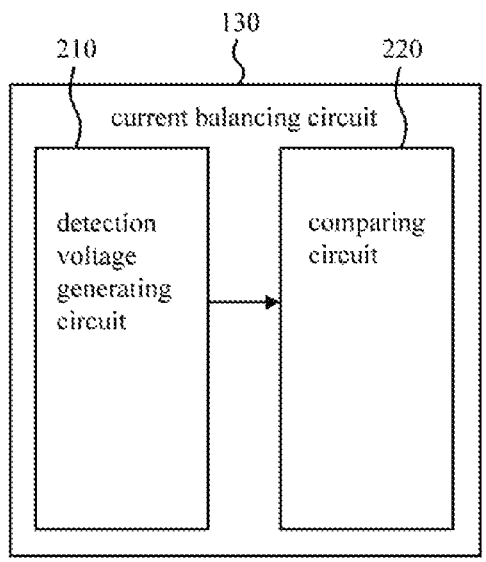
FIG. 2 illustrates an embodiment of the current balancing circuit of FIG. 1.
Figure 3A:
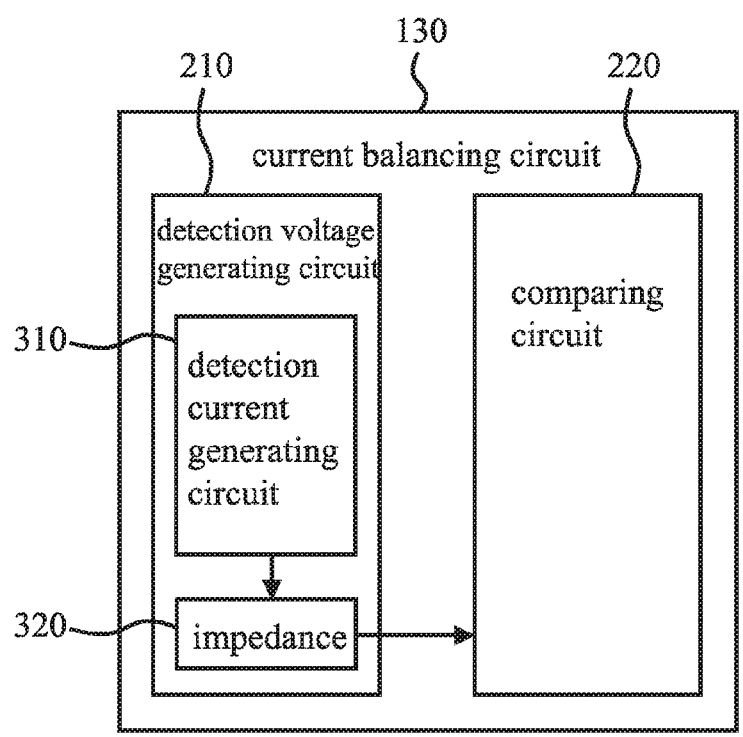
FIG. 3a illustrates an embodiment of the detection voltage generating circuit of FIG. 2.
Figure 3B:
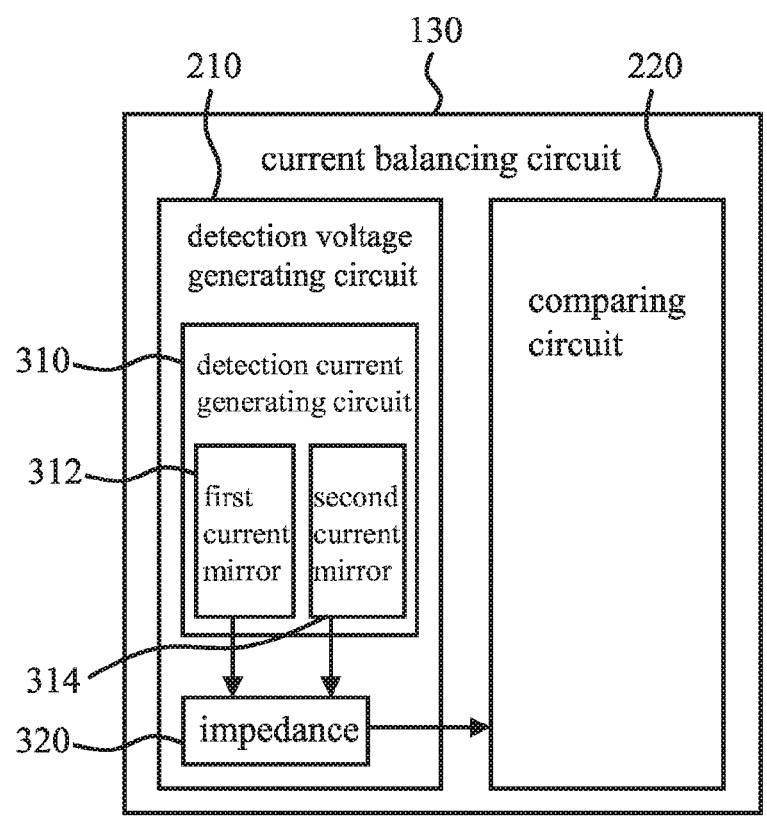
Figure 3C:
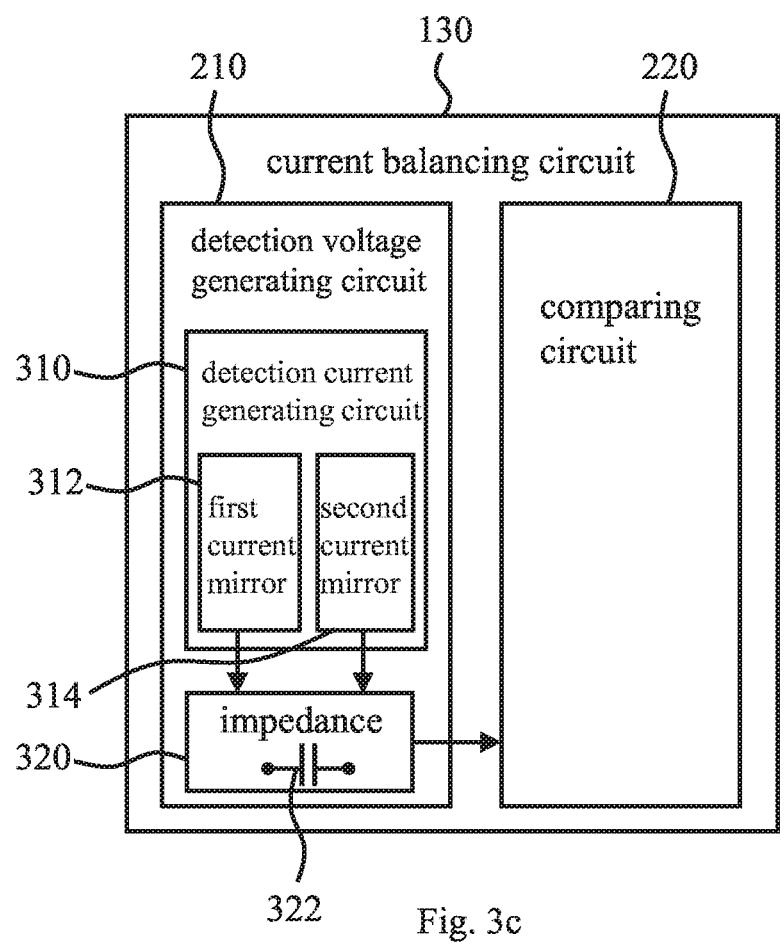
FIG. 3c illustrates an embodiment of the impedance of FIG. 3b.

Please refer to FIG. 2 which illustrates an embodiment of the current balancing circuit 130 of FIG. 1. The current balancing circuit 130 in this embodiment includes: a detection voltage generating circuit 210 operable to generate at least one detection voltage according to the output current Iout and input current Iin; and a comparing circuit 220 operable to execute comparison according to the detection voltage, then determine whether the difference between the output current Iout and input current Iin satisfies the predetermined requirement, and accordingly generate the aforementioned at least one adjustment signal or its antecedent signal. Besides, as it is shown in FIG. 3a, an embodiment of said detection voltage generating circuit 210 includes: a detection current generating circuit 310 operable to generate a detection current according to the output and input currents Iout, Iin; and at least an impedance 320 operable to generate the detection voltage in accordance with the detection current. Furthermore, as it is shown in FIG. 3b, an embodiment of said detection current generating circuit 310 includes: a first current mirror 312 operable to generate a first current (e.g. Iout/K in which K is an integer) of the detection current according to the output current Iout; and a second current mirror operable to generate a second current (e.g. Iin/K) of the detection current according to the input current Iin. Moreover, as it is shown in FIG. 3c, an embodiment of said impedance 320 includes a capacitor 322 operable to generate the detection voltage in accordance with the difference between the first and second currents.

Figure 4:
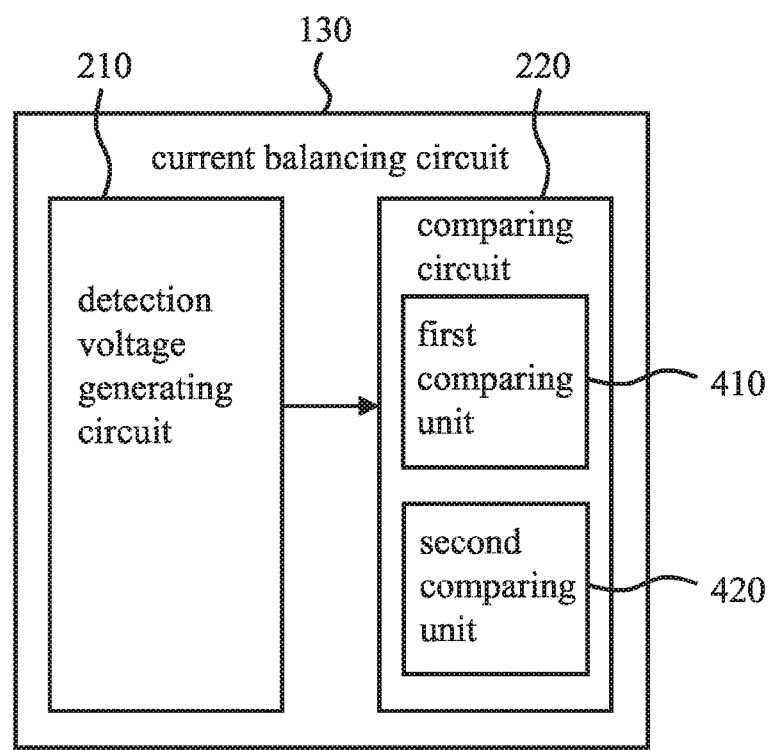
FIG. 4 illustrates an embodiment of the comparing circuit of FIG. 2.
Figure 5:
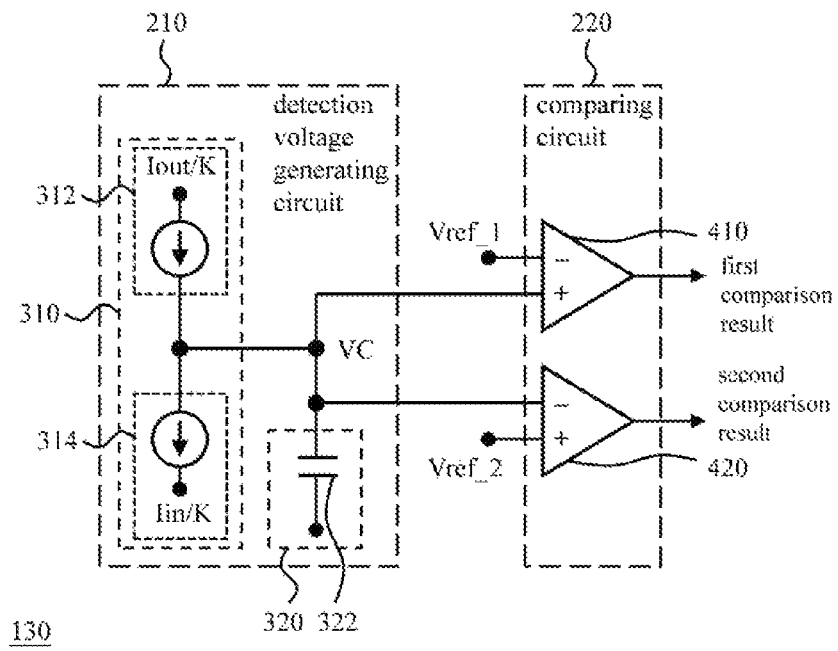
FIG. 5 illustrates an embodiment of combining the current balancing circuit implementations of FIG. 3c and FIG. 4.

Please refer to FIG. 4. An embodiment of the comparing circuit 220 of FIG. 2 includes: a first comparing unit 410 operable to generate a first comparison result according to the aforementioned at least one detection voltage and a first reference voltage; and a second comparing unit 420 operable to generate a second comparison result according to the at least one detection voltage and a second reference voltage in which the first comparison result and/or the second comparison result is(are) treated as the at least one adjustment signal or the antecedent signal thereof. For instance, please refer to FIG. 5 which illustrates an embodiment of combining the current balancing circuit 130 implementations of FIGS. 3c and 4; as it is shown in FIG. 5, the first current Iout/K (in which K is an integer) of the current mirror 312 and the second current Iin/K of the current mirror 314 charge and discharge the capacitor 322 of the impedance 320 respectively, so as to generate the detection voltage VC; afterwards, the first comparing unit 410 will compare the detection voltage VC with the first reference voltage Vref_1 and thereby generate the first comparison result while the second comparing unit 420 will compare the detection voltage VC with the second reference voltage Vref_2 and accordingly generate the second comparison result. Because the first reference voltage Vref_1 and the second reference voltage Vref_2 in this embodiment stand for the upper and lower limits of a predetermined voltage range respectively, if the first comparison result indicates that the detection voltage VC is greater than the first reference voltage Vref_1, which implies that the first current (i.e. Iout/K) of the current mirror 312 is more than the second current (Iin/K) of the current mirror 314 and consequently suggests that the output current Iout is more than the input current Iin, under this circumstance, the first comparison result could be treated as the foresaid adjustment signal or its antecedent signal to increase the resistance of the first adjustable resistor 122 and/or decrease the resistance of the second adjustable resistor 124 in FIG. 1, so as to decrease the output current Iout and/or increase the input current Iin and thereby reduce the difference between the two currents Iout, Iin for current balance.

Figure 6A:
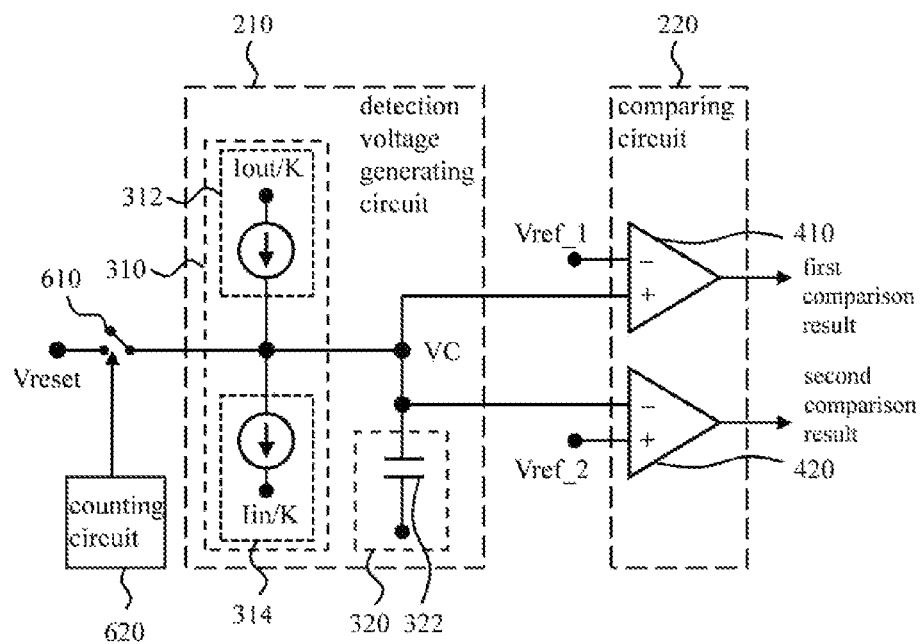
FIG. 6a illustrates another embodiment of combining the current balancing circuit implementations of FIG. 3c and FIG. 4.
Figure 6B:
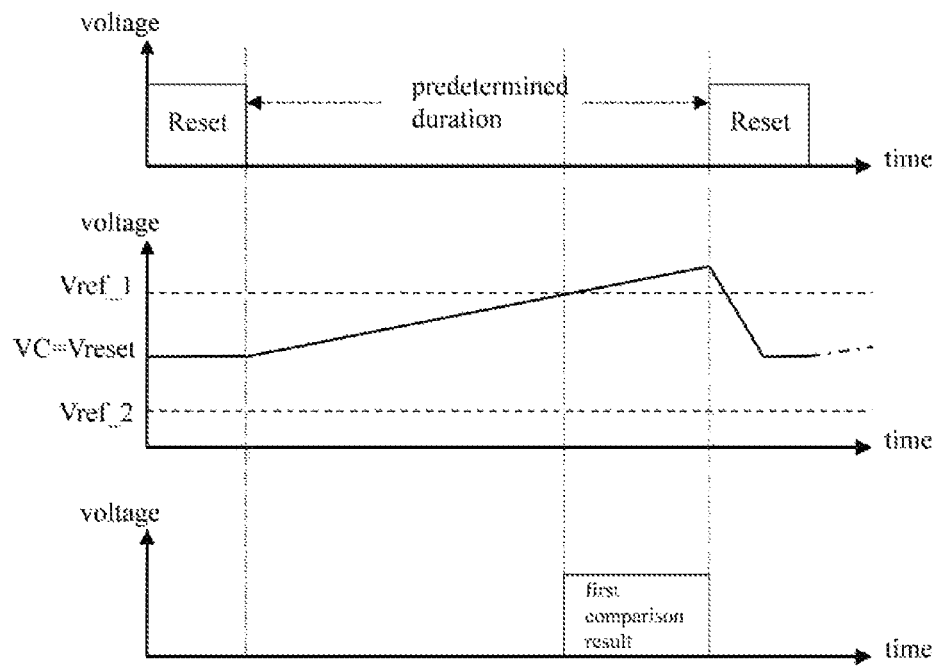
Figure 6C:
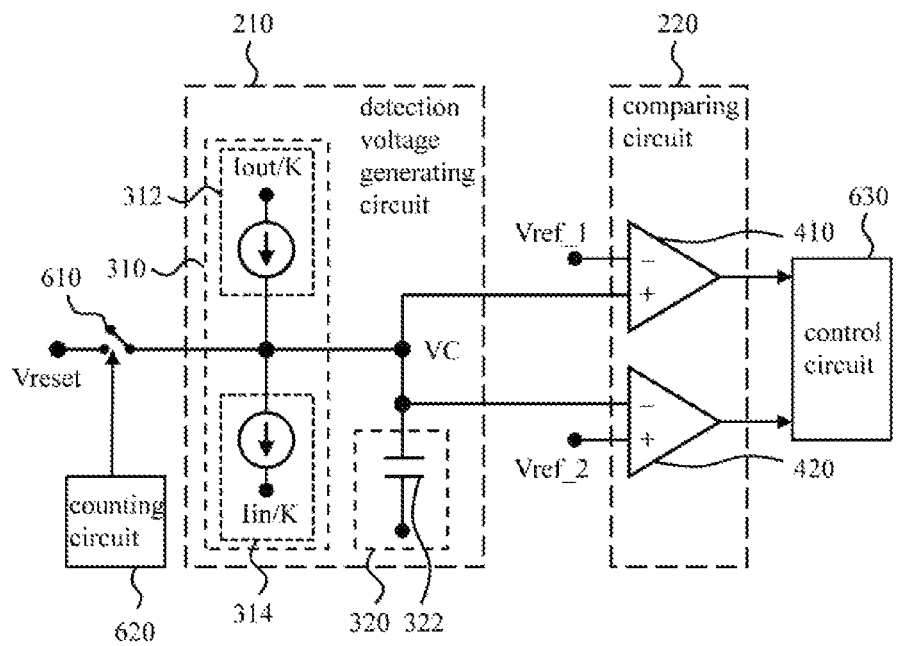
FIG. 6c illustrates a further embodiment of combining the current balancing circuit implementations of FIG. 3c and FIG. 4.

Please note that in the embodiment of FIG. 5, in order to ensure that the detection voltage VC stays within the predetermined voltage range (e.g. VC=(Vref_1+Vref_2)/2) at the beginning, the current balancing circuit 130 (as it is shown in FIG. 6a) may include: a switch 610, coupled between a reference voltage terminal and the comparing circuit 220, operable to be conducting or non-conducting according to the aforementioned predetermined duration and thereby provide an initial detection voltage Vreset (e.g. Vreset=(Vref_1+Vref_2)/2) as the initial value of the detection voltage VC for the comparing circuit 220 during the switch 610 conducting. More specifically, if the output current Iout is equal to the input current Iin, the detection voltage VC will be the same as the initial detection voltage Vreset. Please also note that as it is shown in FIG. 6a, in order to prepare the said predetermined duration for timely circuit operation, the current balancing circuit 130 may further include: a counting circuit 620 operable to count a value related to the predetermined duration and thereby generate a reset signal Reset to control the switch 610 to be conducting or non-conducting. In this embodiment, the predetermined duration is defined by adjacent two of the reset signals Reset (as shown in FIG. 6b); when the reset signal Reset stays at a high level, the switch 610 will be conducting to make the detection voltage VC equivalent or close to the initial detection voltage Vreset; in the predetermined duration (ie. during the reset signal Reset staying at a low level), the switch 610 will be non-conducting to make the capacitor 322 determine the value of the detection voltage VC according to the first current Iout/K and second current Iin/K, so as to allow the comparing circuit 220 to carry out comparison properly. The waveform diagram of the relevant signals is shown in FIG. 6b (although FIG. 6b is under a circumstance that the output current Iout is more than the input current Iin and thus the detection voltage VC grows gradually, other circumstances could be derived in a similar way). Please further note that as it is shown in FIG. 6c, if the aforementioned at least one comparison result is treated as the antecedent signal of the at least one adjustment signal, the current balancing circuit 130 may further include: a control circuit 630 operable to generate the at least one adjustment signal in accordance with the antecedent signal. For instance, if the antecedent signal (i.e. the one or more comparison results) indicates that the output current Iout should be raised and/or the input current Iin should be reduced, the control circuit 630 will generate the at least one adjustment signal according to the antecedent signal plus a built-in adjustment rule and thereby adjust one or all of the adjustable resistors 122, 124 of FIG. 1 in which the built-in adjustment rule could be defined by those of ordinary skill in the art in light of the disclosure of this specification.

Figure 7:
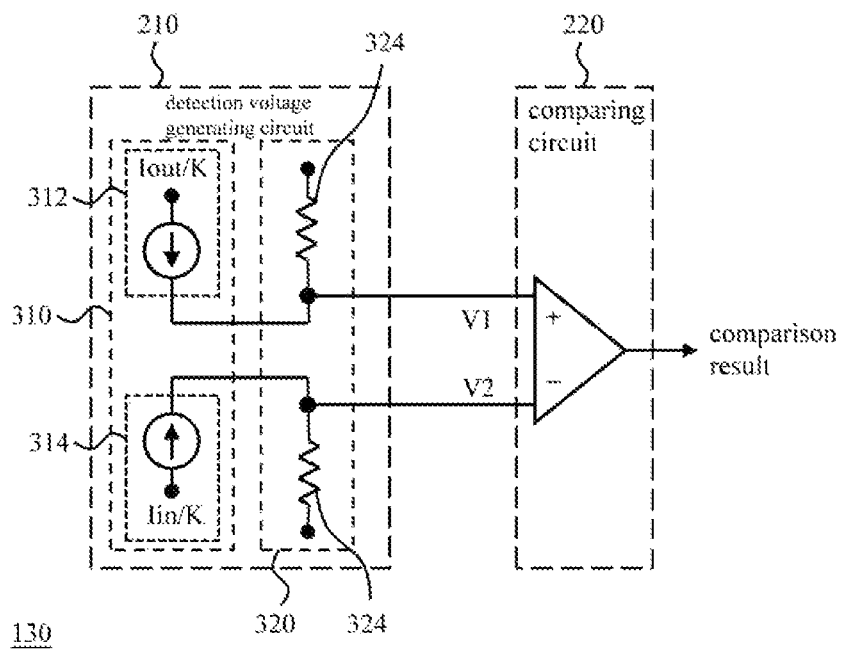
FIG. 7 illustrates an embodiment of the current balancing circuit of FIG. 3b.

The above-described embodiment of generating the at least one adjustment signal is for people of ordinary skill in the art to understand the present invention, not for confinement to the scope of the present invention. In other words, any means capable of generating the adjustment signal according to the difference between the output current Iout and input current Iin to thereby reduce the current difference could be adopted in this invention. For instance, as it is shown in FIG. 7, the at least one impedance 320 may include two resistors 324 of the same resistance operable to respectively generate a first voltage V1 according to the first current Iout/K of the current mirror 312 and generate a second voltage V2 according to the second current Iin/K of the current mirror 314; afterwards, the comparing circuit 220 can compare the first voltage V1 with the second voltage V2 to generate a comparison result; and if the comparison result indicates that the first voltage V1 is greater than the second voltage V2, which implies that the first current Iout/K of the current mirror 312 is more than the second current Iin/K of the current mirror 314 (i.e. the output current Iout more than the input current Iin), the comparison result will be used as the aforementioned adjustment signal or its antecedent signal to increase the impedance of the first adjustable resistor 122 and/or decrease the impedance of the second adjustable resistor 124 of FIG. 1, so that the difference between the two currents will be diminished and the purpose of current balance will be fulfilled. For another instance, the two resistors 324 of FIG. 7 could be replaced with a single resistor (not shown); meanwhile, the single resistor may be coupled to the current mirrors 312, 314 successively through a switching circuit (not shown) to thereby generate the first voltage V1 and second voltage V2 one by one; then the comparing circuit 220 may use a component such as a delay unit or a latch (not shown) to defer or temporarily store the first voltage V1 for the following comparison operation. Similar examples could be derived by those of ordinary skill in the art in light of the disclosure of this specification, and therefore redundant description is omitted.

Figure 8:
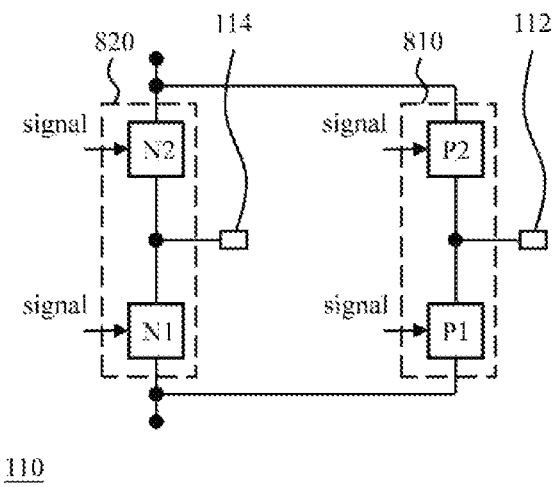
FIG. 8 illustrates an embodiment of the transmission circuit of FIG. 1.

Please refer to FIG. 8 which illustrates an embodiment of the transmission circuit 110 of FIG. 1. As it is shown in FIG. 8, the transmission circuit 110 includes: an output-end transistor pair 810 including a MOS transistor P1 and a MOS transistor P2 coupled with the aforementioned output end 112; and an input-end transistor pair 820 including a MOS transistor N1 and a MOS transistor N2 coupled with the aforementioned input end 114. In this embodiment, during the transmission circuit 110 sending a signal within the positive half cycle thereof, the transistor P2 is responsible for providing the output current Iout and the transistor N1 is responsible for providing the input current Iin while the transistors P1, N2 have static currents running therethrough; on the other hand, during the transmission circuit 110 sending the signal within the negative half cycle thereof, the transistor P1 is responsible for providing the output current Iout and the transistor N2 is responsible for providing the input current Iin while static currents pass through the transistors P2, N1. In light of the above, the pair of transistors P2, N1 and the pair of transistors P1, N2 operate separately. Therefore, if the current balance is going to be done in accordance with the difference between the output current Iout and the input current Iin, the first current mirror 312 of FIG. 3b could be coupled with the transistor P2 to generate the aforementioned first current while the second current mirror 314 could be coupled with the transistor N1 to generate the second current; or the first current mirror 312 could be coupled with the transistor P1 to generate the first current while the second current mirror 314 could be coupled with the transistor N2 to generate the second current. However, since the manufacturing process variation or other background factors might lead to the size or characteristic difference between the transistors P2, N1 and/or transistors P1, N2, which consequently causes the inherent difference between the mirror currents of the first and second current mirrors 312, 314 and may mislead the current balancing circuit 130 to take the influence of the transistor difference to be the influence of the aforementioned impedance difference between the output and input paths, an unnecessary adjustment might be made in the adjustable resistor 120 of FIG. 1. In consideration of the above problems, the present invention further provides a calibration process to calibrate and compensate for the inherent current difference ΔI between the mirror currents of the current mirrors 312, 314 in advance, so as to ensure that the following balance process runs on a reliable basis.

Figure 9A:
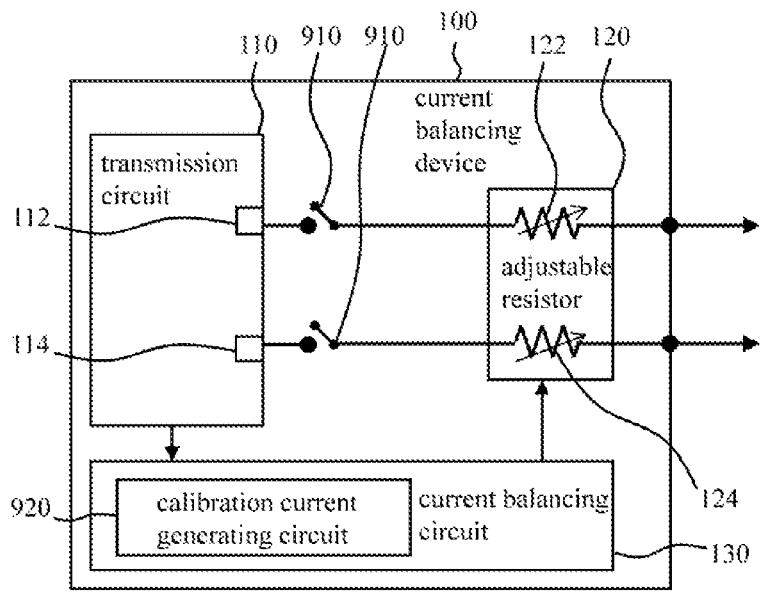
FIG. 9a illustrates another implementation example of the current balancing device of FIG. 1.
Figure 9B:
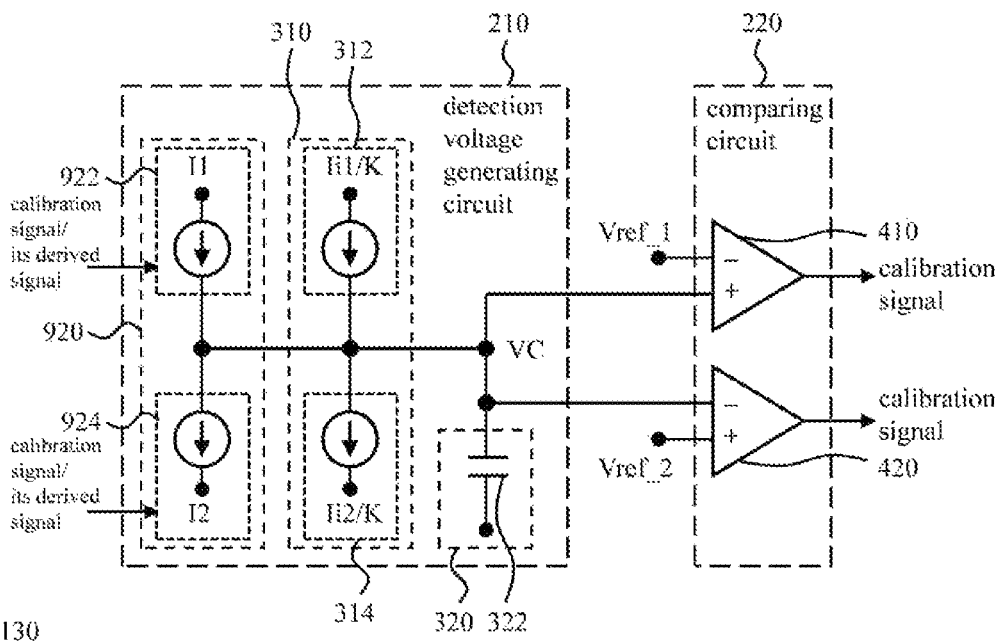

Please refer to FIG. 9a. In order to realize said calibration process, the current balancing device 100 further comprises: two switches 910 operable to be conducting or non-conducting in accordance with a pre-calibration signal, so as to form or break up the current loop. To be more specific; if the pre-calibration signal indicates that the calibration process is ready to go, the two switches 910 will be turned off (i.e. non-conducting) to allow the execution of the calibration process. Besides, as it is shown in FIG. 9b, the current balancing circuit 130 in this case includes: a calibration current generating circuit 920 operable to provide a calibration current according to a calibration signal, so as to compensate for the aforementioned current difference ΔI. More specifically, please refer to FIG. 9a, FIG. 2 and FIG. 8; when the two switches 910 are non-conducting, the detection voltage generating circuit 210 will generate at least one calibration voltage according to a first internal current (e.g. the current of transistor P2 or P1) and a second internal current (e.g. the current of transistor N1 or N2) of the transmission circuit 110; the comparing circuit 200 will carry out comparison according to the at least one calibration voltage to determine whether the difference (relevant to the current difference ΔI) between the first and second internal currents satisfies another predetermined requirement, and thereby generate a calibration signal; and the calibration current generating circuit 920 will provide at least one calibration current according to the calibration signal and thereby compensate for the difference between the first and second internal currents. For instance, please refer to FIG. 9a, FIG. 2 and FIG. 9b; the calibration current generating circuit 920 includes a first calibration current source 922 and a second calibration current source 924; when the calibration signal indicates that the first internal current Ii1 is more than the second internal current Ii2, the second calibration current source 924 will increase the amount of a second calibration current I2 according to the calibration signal or the signal derived therefrom to thereby compensate for the deficit of the second internal current Ii2; on the other hand, when the calibration signal indicates that the second internal current Ii2 is more than the first internal current Ii1, the first calibration current source 922 will increase the amount of a first calibration current I1 according to the calibration signal or the dependent signal thereof to thereby compensate for the deficit of the first internal current Ii1. This calibration process could be carried out repeatedly until the detection voltage VC has satisfied the aforementioned another predetermined requirement. Since the calibration process is similar to the fore-disclosed current balance process, those of ordinary skill in the art can therefore appreciate the implementation detail and the modification thereof by referring to the preceding paragraphs; therefore, provided the remaining disclosure is enough for understanding and enablement, repeated and redundant description is omitted here.

Additionally, the present invention can not only use a set of the current balancing circuit 130 to carry out the current balance during the positive or negative half cycle of the signal, but also use two sets of the current balancing circuit 130 to carry out the current balance during the positive and negative half cycles of the signal respectively. Besides, the aforementioned predetermined requirement could be determined by one of ordinary skill in the art in light of the disclosure of this specification, or may include at least one of the follows: in the foresaid predetermined duration, the difference between the output current Iout and input current Iin less than a predetermined range; in an interval between adjacent two of the predetermined durations (e.g. when the reset signal Reset stays at a high level), the difference between the output current Iout and input current Iin reaching the upper and lower limits of a predetermined range; and in a period, the magnitude of the output current Iout and the magnitude of the input current Iin take the lead alternatively for a predetermined times. Said another predetermined requirement of the calibration process could be similar to the predetermined requirement, or determined by an ordinary skilled person according to the content of this specification.

Figure 10:
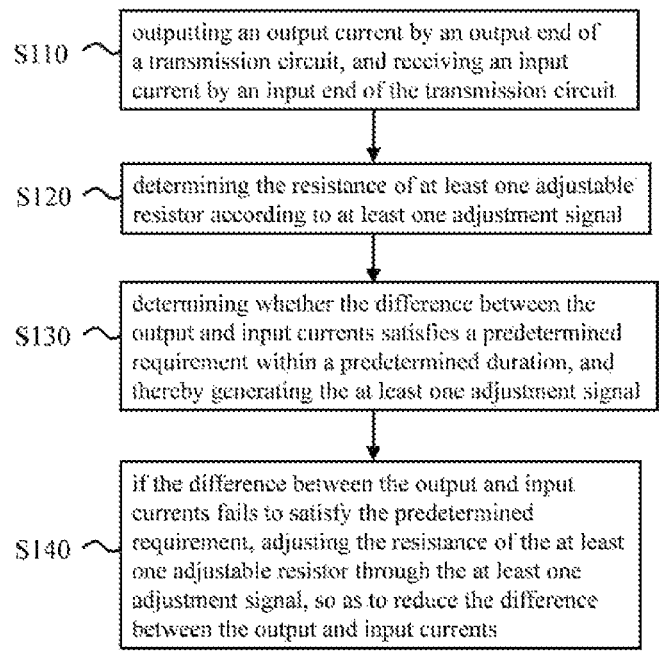
FIG. 10 illustrates an embodiment of the current balancing method of the present invention.

In addition to the above-disclosed current balancing device 100, the present invention also discloses a current balancing method capable of balancing an output current and an input current of a current loop. As it is shown in FIG. 10, an embodiment of the current balancing method comprises the following steps:

Step S110: outputting an output current of a current loop by an output end of a transmission circuit, and receiving an input current of the current loop by an input end of the transmission circuit. This step could be carried out by the transmission circuit 110 of FIG. 1 or its equivalent.

Step S120: determining the resistance of at least one adjustable resistor set in the current loop according to at least one adjustment signal. This step could be realized by the adjustable resistor 120 of FIG. 1 or its equivalent.

Step S130: determining whether the difference between the output and input currents satisfies a predetermined requirement within a predetermined duration, and thereby generating the at least one adjustment signal. This step could be executed by the current balancing circuit 130 or the equivalent thereof.

Step S140: if the difference between the output and input currents fails to satisfy the predetermined requirement, adjusting the resistance of the at least one adjustable resistor through the at least one adjustment signal, so as to reduce the difference between the output and input currents, wherein the predetermined requirement could be defined by one of ordinary skill in the art in light of the disclosure of this specification or may include at least one of the follows: in the said predetermined duration, the difference between the output current and input current less than a predetermined range; in an interval between adjacent two of the predetermined durations, the difference between the output current and input current reaching the upper and lower limits of a predetermined range; and in a period, the magnitude of the output current and the magnitude of the input current get ahead by turns for a predetermined times. This step could be carried out by the current balancing circuit 130 and the adjustable resistor 120 of FIG. 1 or the equivalents thereof.

On the basis of the above description, an embodiment of step S130 includes: generating at least one detection voltage according to the output and input currents; and determining whether the difference between the output and input currents satisfies the predetermined requirement in accordance with the at least one detection voltage, and thereby generating the at least one adjustment signal or the antecedent signal thereof. An embodiment of the step of generating the detection voltage includes: generating at least one detection current according to the output and input currents; and generating the at least one detection voltage according to the at least one detection current and at least an impedance. An embodiment of the step of generating the detection current includes: generating a first current of the at least one detection current according to the output current in which the first current is less than the output current; and generating a second current of the at least one detection current according to the input current in which the second current is less than the input current. An embodiment of the at last one impedance includes a capacitor; meanwhile, the step of generating the detection voltage further includes: generating the at least one detection voltage according to the difference between said first and second currents and the capacitor.

Please refer to FIG. 10 again. An embodiment of step S140 includes: generating a first comparison result according to the at least one detection voltage and a first reference voltage; and generating a second comparison result according to the at least one detection voltage and a second reference voltage, wherein the first comparison result and/or the second comparison result is(are) treated as the at least one adjustment signal or its antecedent signal. Besides, in order to ensure that the initial value of the at least one detection voltage stays between the first and second reference voltages and thereby assist the operation of comparison, the embodiment of FIG. 10 may further comprise the following steps: providing an initial detection voltage to be the initial value of the at least one detection voltage before the predetermined duration starts; in this case if the output and input currents are the same, the at least one detection voltage will be equal to the initial detection voltage after the predetermined duration ends. Furthermore, in order to prevent the at least one detection voltage from the influence of circuit variation, the present method invention may further comprise a pre-calibration step to compensate for the circuit variation. An embodiment of the pre-calibration step includes: breaking up the aforementioned current loop; generating at least a calibration voltage according to a first internal current and a second internal current while the first internal current is related to a first internal component (e.g. the transistor P2 or P1 in FIG. 8) and the second internal current is related to a second internal component (e.g. the transistor N1 or N2 in FIG. 8); executing comparison according to the at least one calibration voltage and thus determining whether the difference between the first and second internal currents satisfies another predetermined requirement, so as to generate a calibration signal; and providing a calibration current according to the calibration signal to thereby compensate for the difference between the first and second internal currents. Obviously, the difference between the first and second internal currents is relevant to the value of the detection voltage.

Since those of ordinary skill in the art can appreciate the implementation detail and the modification thereto of this method invention by referring to the fore-described device invention of FIG. 1 through FIG. 9b, repeated and redundant description is therefore omitted provided that the remaining disclosure is still enough for understanding and enablement. Please note that although some voltage terminals in the figures are not marked with specific values, those of ordinary skill in the art are still able to appreciate how to determine the voltage values according to the disclosure in this specification and the common knowledge in this field; for instance, the current mirror 312 of FIG. 5 could be coupled with a high voltage while the current mirror 314 and capacitor 322 could be coupled to ground, or the transistors N2, P2 of FIG. 8 could be coupled with a high voltage while the transistors N1, P1 could be coupled to ground. Besides, the shape, size, and ratio of any element and the step sequence of any flow chart in the figures are just exemplary for understanding, not for limiting the scope of this invention. Please note that each embodiment in the foregoing description includes one or more features; however, this doesn't mean that one carrying out the present invention should make use of all the features of one embodiment at the same time, or should only carry out different embodiments separately. In other words, if an implementation derived from one or more of the embodiments is practicable, a person of ordinary skill in the art can selectively make use of some or all of the features in one embodiment or selectively make use of the combination of some or all features in several embodiments to have the implementation come true, so as to increase the flexibility of carrying out the present invention.

In summary, the current balancing device and method of the present invention include at least the following advantages. First, the output and input currents could be balanced adaptively to thereby avoid the problems of the prior art such as EMI. Second, a calibration process could be carried out to compensate for the influence of asymmetric internal elements caused by manufacturing process variation, so as to make sure that the result of current balance will be accurate. Third, one or more sets of current balancing circuit could be used optionally, so that the current balance process could be done efficiently or rapidly. Fourth, the position and amount of adjustable resistor could be determined optionally, and the resistance of some or all of the adjustable resistors could be modified flexibly, so that the current balance process could be done more quickly.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A current balancing device capable of balancing an output current and an input current of a current loop, comprising:
   a transmission circuit including an output end and an input end operable to output the output current and receive the input current respectively;
   at least one adjustable resistor set in the current loop, operable to provide resistance according to at least one adjustment signal; and
   a current balancing circuit, coupled to the transmission circuit and the at least one adjustable resistor, operable to determine whether the difference between the output and input currents satisfies a predetermined requirement in light of a predetermined duration and thereby generate the at least one adjustment signal,
   wherein if the difference between the output and input currents fails to satisfy the predetermined requirement, the current balancing circuit is operable to adjust the resistance of the at least one adjustable resistor through the at least one adjustment signal, so as to reduce the difference between the output and input currents.

2. The current balancing device of claim 1, wherein the current balancing circuit includes:
a detection voltage generating circuit operable to generate at least one detection voltage according to the output and input currents; and
a comparing circuit operable to execute comparison according to the detection voltage, then determine whether the difference between the output and input currents satisfies the predetermined requirement, and accordingly generate the at least one adjustment signal or the antecedent signal thereof.

3. The current balancing device of claim 2, wherein the detection voltage generating circuit includes:
a detection current generating circuit operable to generate a detection current according to the output and input currents; and
at least an impedance operable to generate the detection voltage in accordance with the detection current.

4. The current balancing device of claim 3, wherein the detection current generating circuit includes:
a first current mirror operable to generate a first current of the detection current according to the output current; and
a second current mirror operable to generate a second current of the detection current according to the input current,
and the impedance includes:
a capacitor operable to generate the detection voltage in accordance with the difference between the first and second currents.

5. The current balancing device of claim 2, wherein the comparing circuit includes:
a first comparing unit operable to generate a first comparison result according to the detection voltage and a first reference voltage; and
a second comparing unit operable to generate a second comparison result according to the detection voltage and a second reference voltage,
wherein the first and/or second comparison result is treated as the at least one adjustment signal or the antecedent signal thereof.

6. The current balancing device of claim 2, wherein the current balancing circuit further includes:
a control circuit operable to generate the at least one adjustment signal according to the antecedent signal.

7. The current balancing device of claim 2, wherein the current balancing circuit further includes:
a switch coupled between a reference voltage terminal and the comparing circuit, operable to be conducting or non-conducting according to the predetermined duration, and thereby provide an initial detection voltage as the initial value of the detection voltage for the comparing circuit when the switch is conducting,
wherein if the output and input currents are equal, the detection voltage is equivalent to the initial detection voltage.

8. The current balancing device of claim 7, further comprising:
a counting circuit operable to count a value related to the predetermined duration and thereby control the switch to be conducting or non-conducting.

9. The current balancing device of claim 2, wherein the transmission circuit includes:
two switches operable to be conducting or non-conducting in light of a pre-calibration signal, so as to form or break up the current loop,
in which the current balancing circuit includes a calibration current generating circuit, and the detection voltage generating circuit is operable to generate at least one calibration voltage according to a first and a second internal currents of the transmission circuit when the two switches are non-conducting;
the comparing circuit is operable to carry out comparison according to the calibration voltage to determine whether the difference between the first and second internal currents satisfies another predetermined requirement, and thereby generate a calibration signal; and
the calibration current generating circuit is operable to provide at least one calibration current according to the calibration signal and accordingly compensate for the difference between the first and second internal currents while the difference between the first and second internal currents is relevant to the value of the detection voltage.

10. The current balancing device of claim 9, wherein the calibration current generating circuit includes:
a first calibration current source operable to increase the calibration current according to the calibration signal; and
a second calibration current source operable to decrease the calibration current according to the calibration signal.

11. The current balancing device of claim 1, wherein the predetermined requirement includes at least one of the follows:
in the predetermined duration, the difference between the output and input currents staying within a predetermined range; and
in an interval between adjacent two of the predetermined durations, the difference between the output and input currents reaching the upper and lower limits of the predetermined range.

12. The current balancing device of claim 1, wherein the current loop is an alternating current (AC) coupling current loop.

13. A current balancing method capable of balancing an output current and an input current of a current loop, comprising the following steps:
outputting the output current by an output end of a transmission circuit, and receiving the input current by an input end of the transmission circuit;
determining the resistance of at least one adjustable resistor according to at least one adjustment signal;
determining whether the difference between the output and input currents satisfies a predetermined requirement within a predetermined duration, and thereby generating the adjustment signal; and
if the difference between the output and input currents fails to satisfy the predetermined requirement, adjusting the resistance of the adjustable resistor through the adjustment signal, so as to reduce the difference between the output and input currents.

14. The current balancing method of claim 13, wherein the step of generating the adjustment signal includes:
generating at least one detection voltage according to the output and input currents; and
determining whether the difference between the output and input currents satisfies the predetermined requirement according to the detection voltage, so as generate the adjustment signal or the antecedent signal thereof.

15. The current balancing method of claim 14, wherein the step of generating the detection voltage includes:
generating at least one detection current according to the output and input currents; and
generating the detection voltage according to the detection current and an impedance.

16. The current balancing method of claim 15, wherein the step of generating the detection current includes:
generating a first current of the detection current according to the output current in which the first current is less than the output current; and
generating a second current of the detection current according to the input current in which the second current is less than the input current,
and the impedance includes a capacitor while the step of generating the detection voltage includes: generating the detection voltage according to the difference between the first and second currents and the capacitance of the capacitor.

17. The current balancing method of claim 14, wherein the step of generating the adjustment signal includes:
generating a first comparison result according to the detection voltage and a first reference voltage; and
generating a second comparison result according to the detection voltage and a second reference voltage,
wherein the first and/or second comparison result is used as the adjustment signal or the antecedent signal thereof.

18. The current balancing method of claim 14, further comprising:
providing an initial detection voltage as the initial value of the detection voltage before the start of the predetermined duration,
wherein if the output and input currents are equivalent, the detection voltage is equal to the initial detection voltage at the end of the predetermined duration.

19. The current balancing method of claim 14, further comprising a pre-calibration step which includes:
breaking up the current loop;
generating at least a calibration voltage according to a first internal current and a second internal current;
executing comparison according to the calibration voltage and thus determining whether the difference between the first and second internal currents satisfies another predetermined requirement, so as to generate a calibration signal; and
providing a calibration current according to the calibration signal to thereby compensate for the difference between the first and second internal currents,
wherein the difference between the first and second internal currents is relevant to the value of the detection voltage.

20. The current balancing method of claim 13, wherein the predetermined requirement includes at least one of the follows:
in the predetermined duration, the difference between the output and input currents staying within a predetermined range; and
in an interval between adjacent two of the predetermined durations, the difference between the output and input currents reaching the upper and lower limits of the predetermined range.

* * * * *